US012035470B2

United States Patent
Koshiji et al.

(10) Patent No.: US 12,035,470 B2
(45) Date of Patent: Jul. 9, 2024

(54) ELECTROCONDUCTIVE SUBSTRATE HAVING METAL WIRING, METHOD FOR PRODUCING THE ELECTROCONDUCTIVE SUBSTRATE, AND METAL INK FOR FORMING METAL WIRING

(71) Applicant: TANAKA KIKINZOKU KOGYO K.K., Tokyo (JP)

(72) Inventors: Kenjiro Koshiji, Tsukuba (JP); Yuichi Makita, Tsukuba (JP); Noriaki Nakamura, Tsukuba (JP); Masato Kasuga, Tsukuba (JP); Yuusuke Ohshima, Tsukuba (JP); Hiroki Sato, Tsukuba (JP); Hitoshi Kubo, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 550 days.

(21) Appl. No.: 17/294,260

(22) PCT Filed: Nov. 13, 2019

(86) PCT No.: PCT/JP2019/044507
§ 371 (c)(1),
(2) Date: May 14, 2021

(87) PCT Pub. No.: WO2020/100934
PCT Pub. Date: May 22, 2020

(65) Prior Publication Data
US 2022/0015232 A1    Jan. 13, 2022

(30) Foreign Application Priority Data
Nov. 16, 2018    (JP) .................................. 2018-215738

(51) Int. Cl.
*H05K 1/09*       (2006.01)
*C09D 11/037*    (2014.01)
(Continued)

(52) U.S. Cl.
CPC ........... *H05K 1/092* (2013.01); *C09D 11/037* (2013.01); *H01B 1/026* (2013.01); *H05K 3/1258* (2013.01); *C09D 11/52* (2013.01)

(58) Field of Classification Search
CPC ........................... H05K 1/092; H05K 3/1258
See application file for complete search history.

(56) References Cited

U.S. PATENT DOCUMENTS

2005/0285084 A1   12/2005   Fujii et al.
2008/0286488 A1   11/2008   Li et al.
(Continued)

FOREIGN PATENT DOCUMENTS

JP    2002-298665 A    10/2002
JP    2011-082211 A    4/2011
(Continued)

OTHER PUBLICATIONS

Machine translation of JP2016-048601 Apr. 2016 (Year: 2016).*
(Continued)

*Primary Examiner* — Jeremy C Norris
(74) *Attorney, Agent, or Firm* — Foley & Lardner LLP

(57) ABSTRACT

An electroconductive substrate including a base material and a metal wiring made of at least either of silver and copper, and the electroconductive substrate has an antireflection region formed on part or all of the metal wiring surface. This antireflection region is composed of roughened particles made of at least either of silver and copper and blackened particles finer than the roughened particles and embedded between the roughened particles. The blackened particles are made of silver or a silver compound, copper or a copper (Continued)

No. 1 (ROUGHENED PARTICLES: Ag 172.9 nm / BLACKENED PARTICLES Ag 14.6 nm)

No. 8 (ROUGHENED PARTICLES: Ag 184.5 nm / BLACKENED CARBON PARTICLES Ag 51.7 nm)

compound, or carbon or an organic substance having a carbon content of 25 wt % or more. The antireflection region has a surface with a center line average roughness of 15 nm or more and 70 nm or less. The electroconductive substrate is formed from metal wiring from a metal ink that forms roughened particles, followed by application of a blackening ink containing blackened particles.

19 Claims, 3 Drawing Sheets

(51) Int. Cl.
  *H01B 1/02* (2006.01)
  *H05K 3/12* (2006.01)
  *C09D 11/52* (2014.01)

(56) References Cited

U.S. PATENT DOCUMENTS

| | | |
|---|---|---|
| 2014/0306263 A1 | 10/2014 | Garbar et al. |
| 2016/0132141 A1 | 5/2016 | Chung et al. |
| 2017/0038682 A1 | 2/2017 | Suwa et al. |
| 2017/0256332 A1 | 9/2017 | Miyazaki et al. |
| 2018/0171159 A1 | 6/2018 | Ooi et al. |

FOREIGN PATENT DOCUMENTS

| | | |
|---|---|---|
| JP | 2014-165263 A | 9/2014 |
| JP | 2016-048601 A | 4/2016 |
| JP | 2016-527659 A | 9/2016 |
| WO | WO-2018/212114 A1 | 11/2018 |

OTHER PUBLICATIONS

International Searching Authority, "International Search Report," issued in connection with International Patent Application No. PCT/JP2019/044507, dated Jan. 28, 2020.

International Searching Authority, "Written Opinion," issued in connection with International Patent Application No. PCT/JP2019/044507, dated Jan. 28, 2020.

Supplementary Partial European Search Report issued in corresponding European Patent Application No. 19883968, dated Jul. 22, 2022.

Extended European Search Report issued in corresponding European Patent Application No. 19883968, dated Oct. 13, 2022.

\* cited by examiner

AFTER METAL
WIRING FORMATION

ROUGHENED
PARTICLES (Ag)

BLACKENED
PARTICLES
(Ag)

AFTER BLACKENED INK
APPLICATION

No. 1 (ROUGHENED PARTICLES: Ag 172.9 nm / BLACKENED PARTICLES Ag 14.6 nm)

No. 8 (ROUGHENED PARTICLES: Ag 184.5 nm / BLACKENED CARBON PARTICLES Ag 51.7 nm)

No. 1 (ROUGHENED PARTICLES: Ag 172.9 nm / BLACKENED PARTICLES Ag 14.6 nm)

No. 8 (ROUGHENED PARTICLES: Ag 184.5 nm / BLACKENED CARBON PARTICLES Ag 51.7 nm)

ELECTROCONDUCTIVE SUBSTRATE HAVING METAL WIRING, METHOD FOR PRODUCING THE ELECTROCONDUCTIVE SUBSTRATE, AND METAL INK FOR FORMING METAL WIRING

CROSS-REFERENCE TO RELATED APPLICATIONS

The present application claims priority under 37 U.S.C. § 371 to International Patent Application No. PCT/JP2019/044507, filed Nov. 13, 2019, which claims priority to and the benefit of Japanese Patent Application No. 2018-215738, filed on Nov. 16, 2018. The contents of these applications are hereby incorporated by reference in their entireties.

TECHNICAL FIELD

The present invention relates to an electroconductive substrate having a metal wiring formed on a base material surface. Specifically, it relates to an electroconductive substrate having a metal wiring with suppressed light reflection, particularly a thick-film metal wiring that has been difficult to produce with a conventional method. In addition, a method for producing an electroconductive substrate, which includes a method for forming such a metal wiring, and a metal ink for metal wiring formation are also disclosed.

BACKGROUND ART

In a display device, such as a touch panel or a display, or a film heater, an electroconductive substrate including a transparent base material on which a wiring made of a transparent electrode material is formed has been used. As wirings for such electroconductive substrates, oxide-based transparent electrode materials, such as ITO-based materials, have been conventionally applied. However, in response to recent requirements for panel enlargement, etc., the application of metal materials with low electrical resistance, such as silver and copper, has been examined. These metals are excellent electrical conductors, and thus can accommodate the increase in wiring length due to panel enlargement. In addition, although metals, such as silver and copper, are not transparent, when the wiring width is on the order of microns exceeding the visible region for humans, such a material exerts light transmittance like transparent electrodes and can function as a transparent electrode material.

As a means for forming a metal, such as silver or copper, into a wiring as an electrode material, a process that uses a paste ink, in which fine particles of these metals are dispersed in a suitable solvent, is known (in this application, such a paste ink having dispersed therein metal particles is sometimes referred to as "metal ink" or simply as "ink"). In the wiring formation process that uses a metal ink, the metal ink is applied to a base material and then heated, whereby metal particles are bound to each other (sintered) to form a metal film that serves as a wiring. In the wiring formation process that uses a metal ink, as a result of using the metal ink, which is a liquid precursor, a wiring can be formed with any shape/pattern. In addition, because metal particles in the metal ink can be sintered at a relatively low temperature, constituent materials for the base material can also be selected from a wide range including resins and the like.

With respect to the wiring formation process that uses a metal ink, because of the optimization of the configuration of the metal ink and the improvement of application/printing techniques, it has become possible to form a higher-definition wiring ion pattern over a large area. For example, the present applicant has disclosed, by use of a base material containing a fluorine-containing resin, a method for producing an electroconductive substrate, in which a dispersion liquid of metal particles made of silver having a predetermined configuration is used. According to the method for producing an electroconductive substrate disclosed by the present applicant, on a liquid-repellent base material made of a fluorine-containing resin, a functional group (hydrophilic group) is formed on a portion where a wiring ion pattern is to be formed. Then, a metal ink is applied to the base material to join metal particles in the ink to the functional group, and then the metal particles are sintered, thereby forming a metal wiring that is nearly bulky. In this wiring formation process, as a method for forming a functional group on the base material surface, irradiation with light, such as UV light, which is capable of fine patterning, is applied. As a result, high-definition wirings can be efficiently produced. Specifically, even an ultrafine metal wiring having a line width of 1 µm or less can be formed at a high density, and an electroconductive substrate having light transmittance equivalent to the conventional electroconductive substrate that applies a transparent electrode material can be produced.

However, a wiring formed from a metal ink also has points to be improved, which are attributable to being composed of a metal. That is, in the study by the present inventors, the wiring pattern of the conductive substrate provided with the metal wiring produced as described above may be identified by the reflected light from the wiring depending on the viewing angle. A metal wiring is composed of a bulky metal, and a metal with high reflectance, such as silver, is often employed. Therefore, even if the substance (line width) of the metal wiring is not visible at a certain angle, the presence of the wiring may be visible even with the naked eye due to specular reflection of light when the angle changes.

In order to accommodate the problem of reflection on a metal wiring, it is possible to cover the metal wiring surface with a material having no reflectiveness. For example, Patent Document 2 describes a method for producing a transparent electroconductive material, in which a transparent base material having formed thereon an electroconductive patterned layer (wiring) containing silver particles and a binder resin is treated with a hydrochloric acid solution containing tellurium (Te). According to this method, a black compound layer having a constant thickness (blackened layer) is formed on the surface of the electroconductive patterned layer, and such a layer suppresses reflection on the metal wiring.

RELATED ART DOCUMENT

Patent Documents

Patent Document 1: JP 2016-48601 A
Patent Document 2: JP 2011-82211 A

SUMMARY OF THE INVENTION

Problems to be Solved by the Invention

The prior art of Patent Document 2 described above is different in terms of basic matters, such as the method for forming a wiring and its morphology/configuration, but is targeted at metal wirings, and thus is expected to be useful as a technique for reflection suppression. However, according to the study by the present inventors, it has been confirmed that such a colored (blackened) metal wiring obtained by a predetermined chemical conversion treatment has some problems, and it is not so useful.

That is, in the electroconductive substrate described in Patent Document 2, the surface of a metal wiring is completely altered to form a black blackened layer. This blackened layer is made of an oxide or chloride of the metal that constitutes the wiring, an oxide or chloride of Te in the treatment liquid, or the like. Such a blackened layer made of an oxide or the like has some electroconductivity, but its electroconductivity is inferior as compared with pure metals. Thus, when the wiring is completely covered with such an oxide or the like, an increase in the resistance value of the metal wiring is a concern. In addition, changes in resistance due to the reaction of a dissimilar metal, such as Te, with the metal wiring cannot be ignored either. In Patent Document 2, out of some concern about an increase in the resistance value of a metal wiring, the thickness of the blackened layer is restricted. However, in consideration of the reactivity of the blackened layer and the like, the degree of its influence is not clear.

In addition, regarding the conventional art in which a wiring is colored for the purpose of antireflection, the influence on making the metal wiring transparent (reduction of the line width) is also a concern. Even when a metal wiring is finely formed and made transparent, visualization due to coloring makes it meaningless.

The present invention has been accomplished against the above background, and provides an electroconductive substrate having a metal wiring formed by use of a metal ink/paste as a precursor, which has a metal wiring where light reflection is effectively suppressed without a decrease in electrical characteristics. In addition, an electroconductive substrate that allows for the reduction of the line width of a metal wiring is also provided.

Further, the present invention also discloses an electroconductive substrate having a metal wiring that can be provided with higher definition and increased film thickness. Then, a method for producing an electroconductive substrate including such a metal wiring and a metal ink for producing an electroconductive substrate will also be clarified.

Means for Solving the Problems

In order to solve the above problems, the present inventors have made some adjustments to the configuration of a metal ink, and, at the same time, examined/studied the possibility of the formation of metal wirings from the adjusted various metal inks and the morphologies of the formed metal wirings. Then, in the course of study, they have found that as a result of adjusting the surface morphology of a metal wiring, changes occur in its light reflection characteristics.

A metal ink is a solution having dispersed therein metal particles having a particle size on the order of nanometers. In particular, a metal ink conventionally used for metal wiring formation generally contains fine metal particles having a particle size within a range of 5 nm or more and not more than 100 nm. In the study by the present inventors, in addition to the conventional metal ink for metal wirings, metal inks containing metal particles having larger particle sizes are also studied for the possibility of metal wiring formation. In addition, the formation of a metal wiring from a combination of several kinds of metal inks and its morphology has also been studied.

According to the present inventors, on the surface of a metal wiring formed from a metal ink, although some coarsening due to sintering is seen, asperities are formed by metal particles having substantially the same particle size as the metal particles in the ink. Therefore, when a metal wiring is formed from an ink containing metal particles having a large particle size, coarse metal particles are exposed to the surface and form asperities. Such a metal wiring has been conformed to have different light reflection characteristics from a metal wiring produced from the conventional metal ink containing fine metal particles. However, even if the reflection characteristics are different, this does not mean that the coarsening of metal particles that constitute a metal wiring suppresses reflection. Incidentally, it has also been confirmed that even when a metal wiring is composed of coarse metal particles, as long as the wiring width is on the order of microns, the light transmittance is maintained.

Here, the present inventors have experimentally produced a metal wiring by constituting a metal wiring from a metal ink containing metal particles having a large particle size, and then additionally applying the conventional metal ink containing fine particles. Then, the present inventors have found that the surface of such a metal wiring having a complex configuration sometimes has a unique surface morphology, in which coarse particles are partially exposed, and fine particles are embedded in the space between the coarse particles. Further, as a result of studying a metal wiring with such a surface morphology, it has been confirmed that a decrease in light reflectance is seen.

As reasons why light reflection is suppressed on a wiring with a complex surface morphology where particles having different particle sizes are present as described above, the optical characteristics of coarse particles observed in the state of being scattered on the wiring surface and the peculiar action of fine particles in the space between the coarse particles are possible.

Although this phenomenon is not limited to metals, when solid particles are micronized to a particle size on the order of nanometers to submicrons, such particles may have a characteristic tendency in light absorption/scattering characteristics. Also in the metal wirings studied by the present inventors, it is predicted that light absorption/scattering occurs in a region where fine particles are present, causing changes in the reflection characteristics. Then, presumably, because of the cooperation of fine particles having such an action and coarse particles, the wiring is pseudo blackened, whereby reflection can be prevented.

Thus, the present inventors have formed a metal wiring by forming a main body metal wiring from a metal ink having coarse particles, followed by the addition of various fine particles, and studied the relation between its surface morphology and the reflection suppression action. As a result, they have arrived at the present invention.

The present invention is an electroconductive substrate provided with a base material and a metal wiring that is formed on at least one surface of the base material and made of at least either of silver and copper. The electroconductive substrate is configured such that on part or all of the surface of the metal wiring, an antireflection region containing roughened particles that are made of at least either of silver and copper and blackened particles that are embedded between the roughened particles and finer than the roughened particles is formed, the blackened particles are made of at least one of silver or a silver compound, copper or a copper compound, and carbon or an organic substance having a carbon content of 25 wt % or more, and further the antireflection region has a surface with a center line average roughness of 15 nm or more and 70 nm or less. Hereinafter, the configuration of the present invention and its operation will be described in detail.

(I) Configuration of Present Inventive Electroconductive Substrate

With respect to the present invention, first, the configuration of the electroconductive substrate will be described. As described above, the minimum unit of the present inventive electroconductive substrate is a combination of a base material and a metal wiring formed on the base material. Then, the present invention is characterized by the surface morphology of the metal wiring, which has an antireflection region composed of coarse roughened particles that constitute the main body (backbone) of the metal wiring and blackened particles having a smaller particle size than the roughened particles.

A. Base Material

The base material applied to the present invention does not have to be particularly limited, and base materials made of metals and ceramics can be applied. Further, base materials made of resins and plastics are also applicable. In addition, when the weight is not limited, glass can also be used. The base material is preferably formed of a transparent body. This is because the present invention is suitably usable for display devices, such as touch panels and displays. Incidentally, a transparent body herein is a material having a visible light transmittance of 80% or more.

Incidentally, in order to obtain an electroconductive substrate by the method for forming a metal wiring disclosed by the present applicant described above (Patent Document 1), the base material preferably has a fluorine-containing resin layer on a surface on which a metal wiring is to be formed. Although the details will be given below, according to the conventional method for forming a metal wiring of the present applicant, a fluorine-containing resin layer is added in order to impart liquid repellency to a surface of the base material. As long as the region on which a metal wiring is to be formed is included, the fluorine-containing resin layer may be formed over the entire base material or may also be formed on part of the substrate surface. The thickness of the fluorine-containing resin layer is not particularly limited. When the thickness is 0.01 μm or more, liquid repellency is exerted. In addition, when transparency is required, the upper limit of the thickness of the fluorine-containing resin layer is preferably 5 μm.

As the fluorine-containing resin, a fluorine-containing resin that is a polymer having one or two or more kinds of repeating unit based on a fluorine-containing monomer containing a fluorine atom is applicable. In addition, the fluorine-containing resin may also be a polymer having at least one repeating unit based on a fluorine-containing monomer and one or two or more repeating units based on a fluorine-not-containing monomer containing no fluorine atom. Further, the fluorine-containing resin in the present invention may partially contain heteroatoms such as oxygen, nitrogen, and chlorine.

As specific examples of such fluorine-containing resins, polytetrafluoroethylene (PTFE), polychlorotrifluoroethylene (PCTFE), polyvinylidene fluoride (PVDF), polyvinyl fluoride (PVF), a tetrafluoroethylene-perfluoroalkyl vinyl ether copolymer (PFA), a tetrafluoroethylene-hexafluoropropylene copolymer (FEP), an ethylene-tetrafluoroethylene copolymer (ETFE), an ethylene-chlorotrifluoroethylene copolymer (ECTFE), a tetrafluoroethylene-perfluorodioxol copolymer (TFE/PDD), a fluorine-containing resin having a cyclic perfluoroalkyl structure or a cyclic perfluoroalkyl ether structure, and the like can be mentioned.

In addition, in terms of liquid repellency, it is preferable that the fluorine-containing resin is, with respect to the repeating unit based on a fluorine-containing monomer that constitutes the polymer, a fluorine-containing resin composed of a polymer having at least one kind of repeating unit in which the ratio (F/C) of the number of fluorine atoms to the number of carbon atoms is 1.0 or more. The F/C of the repeating unit based on a fluorine-containing monomer is more preferably 1.5 or more. Incidentally, for the reasons of liquid repellency and availability, the upper limit of F/C is preferably 2.0. In addition, in relation to this requirement, a particularly preferred fluorine-containing resin is a perfluoro resin having a repeating unit based on a monomer of a perfluoro compound, in which the F/C in the repeating unit is 1.5 or more.

Further, in consideration of other characteristics in addition to liquid repellency, a favorable fluorine-containing resin can be selected. For example, when the solubility in a solvent for applying a fluorine-containing resin to a base material is considered, as such a fluorine-containing resin, a perfluoro resin having a cyclic structure in the main chain is preferable. At this time, when transparency is required in the fluorine-containing resin layer, it is more preferably to apply an amorphous perfluoro resin. In addition, as a favorable fluorine-containing resin in the exposure operation at the time of functional group formation on the fluorine-containing resin layer described below, a fluorine-containing resin containing at least one oxygen atom in the repeating unit based on a fluorine-containing monomer that constitutes the polymer is preferable.

As preferred fluorine-containing resins in consideration of these characteristics, a perfluoro butenyl vinyl ether polymer (CYTOP®: Asahi Glass Co., Ltd.), a tetrafluoroethylene-perfluorodioxol copolymer (TFE-PDD), Teflon® AF: Mitsui DuPont Fluorochemical Co., Ltd.), a tetrafluoroethylene-perfluoroalkyl vinyl ether copolymer (PFA), a perfluoroalkoxy polymer (Algoflon®: Solvay Japan, Ltd.), and the like can be mentioned.

However, the fluorine resin layer described above is a configuration added to a base material when producing an electroconductive substrate by the wiring formation process (Patent Document 1) of the present applicant described above. Because the metal wiring applied to the electroconductive substrate of the present invention is applicable to other processes/base materials, a fluorine resin layer is not an indispensable configuration of the base material.

B. Metal Wiring

The present invention includes, as a metal wiring, a metal wiring made of at least either of silver and copper. This is because these metals are excellent in electroconductivity and can function as wiring materials. The metal wiring may be made of either metal of silver and copper, or may also be made of both of silver and copper. The latter may be an alloy of silver and copper, and may also be a mixture of metallic silver and metallic copper. In particular, in terms of electroconductivity, it is preferable to apply silver. In addition, the metal wiring may have a monolayer structure, or may alternatively have a multilayer structure. For example, it is possible to apply a metal wiring having a two-layer structure, in which a metal wiring made of copper is placed on a metal wiring made of silver.

The dimension (thickness, line width) of the metal wiring is not limited. However, in consideration of applications to touch panels and the like, a fine line on the order of microns exceeding the visible region is preferable. For this reason, the width of the metal wiring is preferably 0.5 μm or more and 30 μm or less.

In addition, the thickness of the metal wiring is not particularly limited either. Then, the metal wiring of the present invention can easily accommodate film thickening. Conventional metal inks often contain fine metal particles, and the formation of a thick film requires to repeat application and sintering a large number of times. Accordingly, it is substantially difficult to produce a thick-film metal wiring. In the present invention, the main body of the metal wiring is composed of coarse metal particles. Thus, thick-film metal wirings can also be accommodated. The specific range of the thickness of the metal wiring of the present invention may be 0.08 µm or more and 10 µm or less.

C. Antireflection Region

The present inventive electroconductive substrate is characterized in that the above metal wiring at least partially includes an antireflection region. This antireflection region communicates with the main body of the metal wiring and is composed of coarse roughened particles exposed to the wiring surface and blackened particles laid in the space between the roughened particles. Blackened particles are particles that constitute the antireflection region, and also are particles having the action of absorbing/scattering light that enters the electroconductive substrate, thereby suppressing light reflection on the metal wiring.

The antireflection region of the metal wiring on the present inventive electroconductive substrate exerts an antireflection effect as a result of adjustment to a surface morphology formed from roughened particles and blackened particles having different particle sizes. In the conventional art described above (Patent Document 2), reflection is suppressed by coloring (blackening) the surface of the metal wiring. In antireflection by a morphologic factor as in the present invention, the purpose can be exerted regardless of the surface color (the degree of blackening). Then, because blackened particles are mixed with roughened particles made of silver or copper, regardless of the electroconductivity of the blackened particles, the electroconductivity of the entire wiring can be secured. In addition, because the present invention is based on the adjustment of the surface morphology, the influence on the transparency of the wiring is also negligible. Through a combination of coarse roughened particles and fine blackened particles, even a transparent ultrafine metal wiring can be formed, and a surface morphology without reflection can be formed.

As described above, the roughened particles are made of at least either metal of silver and copper. Roughened particles are particles in such a state that metal particles forming the metal wiring are exposed to the wiring surface. Accordingly, the roughened particles are a portion of the metal wiring communicating with the main body of the metal wiring. Because the roughened particles are a portion of the metal wiring, the roughened particles are either silver or copper being the same metal as the metal that constitutes the metal wiring. The size of the roughened particles is preferably such that the average particle size is 40 nm or more and 200 nm or less.

Then, the blackened particles are fine particles having a smaller particle size than the roughened particles, and are an important configuration for suppressing light reflection through the light absorption/scattering effect attributable to such a particle size. The blackened particles are preferably particles having an average particle size that is within a range of 5 nm or more and 80 nm or less and is smaller than the average particle size of the roughened particles.

The blackened particles can be composed of silver or a silver compound, copper or a copper compound, or carbon or an organic substance that is nonmetallic. The reason why a compound of silver or the like, carbon, and the like are applicable unlike the roughened particles is that even when a nonmetal or the like is applied to the blackened particles, the resulting influence on the electroconductivity of the metal wiring is extremely small. The amount of blackened particles adhering to the metal wiring made of silver or copper is negligible. In addition, also on the surface of the metal wiring (antireflection region), the blackened particles are fixed to part of the wiring surface in the state of being mixed with the roughened particles made of silver or copper. For these reasons, the blackened particles have almost no influence on the electroconductivity.

However, even of the electroconductivity is not a concern, it is undesirable to limitlessly set the components for the blackened particles. Thus, it has been decided that in the present invention, as the components for the blackened particles, compounds of metals within the range of constituent metals for the metal wiring (silver or copper) are allowed. In addition, it has also been decided that in addition to these metal compounds, carbon and an organic substance having a carbon content of 25 wt % or more are also allowed as constituent components for the blackened particles. This is because carbon and an organic substance containing a certain amount or more of carbon have low reactivity with silver or copper that constitutes the metal wiring, and limitation thereto minimizes the influence on the resistance value.

When a compound of silver or copper is employed as the blackened particles, oxides, chlorides, and sulfides of these metals can be mentioned. Meanwhile, as nonmetal blackened particles, carbon and organic substances can be mentioned. As specific examples of organic substances, polystyrene, polyurethane, an acrylic resin, an epoxy resin, a melamine resin, glycogen, amylose, cellulose, dextrin, glucan, fructan, chitin, and the like can be mentioned. Blackened particles made of such an organic substance may have a coupling agent adsorbed on the surface of the blackened particles, and such a coupling agent is included in the configuration of the blackened particles. Among these nonmetals, carbon, an acrylic resin, and cellulose lead to particularly preferred blackened particles in terms of influences on the electroconductivity of the metal wiring and also of the antireflection effect.

The effect caused by the antireflection region of the metal wiring of the present invention is affected by the surface morphology formed from the roughened particles and the blackened particles. In the present invention, the surface morphology of the antireflection region is specified by the surface roughness. As indexes for specifying the state of the surface of a metal wiring, in addition to the average particle size of particles, the particle size distribution, the distance between particles, and like various parameters can be mentioned. According to the study by the present inventors and in the case of the present invention, it is difficult to define an antireflection region having a favorable action of light absorption/scattering even when these parameters are separately specified. In this respect, the surface roughness is determined by the particle size and other various parameters being synthetically involved, and the antireflection region of the present invention can be specified appropriately in a simple manner.

The surface roughness of the antireflection region defined in the present invention is a center line average roughness. The center line average roughness is measured about an arbitrary portion (line) of a metal wiring having formed thereon an antireflection region. In the present invention, the center line average roughness can be determined based on JIS B 0601 from data obtained by measuring the surface asperities of a wiring in the height direction by use of a scanning probe microscopy, such as an atomic force microscope (AFM).

Then, in the present invention, the center line average roughness of the antireflection region surface of the metal wiring is specified to be 15 nm or more and 70 nm or less. When the center line average roughness is less than 15 nm, light reflection is not suppressed, and the wiring is visible due to reflected light. Meanwhile, when the center line average roughness is more than 70 nm, metallic luster may appear in the roughened particles or blackened particles, and the function as an antireflection region may be impaired. Incidentally, the center line average roughness is more preferably 15 nm or more and 50 nm or less.

The antireflection region having roughened particles and blackened particles described above is formed on part or all of the metal wiring on the base material. The antireflection region does not have to be formed over the entire surface of the metal wiring or the entire surface of the region that requires antireflection. This is because even if the antireflection region does not cover the entire surface, when the reflection on the entire substrate surface or the region that requires antireflection is weak, the metal wiring is not visible. However, it is preferable that the antireflection region is formed with an area of 50% or more (more preferably 70% or more) of the area of the metal wiring where antireflection is required, and the surface roughness (center line average roughness) of the region is 15 nm or more and 70 nm or less (more preferably 15 nm or more and 50 nm or less). Incidentally, in a portion where it is not problematic that the metal wiring is visible via reflection, naturally, it is not necessary to form an antireflection region.

D. Other Configurations

The present inventive electroconductive substrate described above is composed of the base material and the metal wiring having suitably formed thereon the antireflection region, and may also include an additional configuration in consideration of use for various specific applications such as touch panels, displays, and film heaters. For example, after the formation of the antireflection region, a coating resin layer may be provided on the electroconductive substrate surface. The coating resin layer is formed for the purposes of preventing the metal wiring from migration and protecting metal wiring from moisture and oxidation, as well as prevention of scratches, prevention of delamination, adhesion to other films, and the like. In addition, as materials for the coating resin layer, for example, resins such as a fluorine resin, an acrylic resin, and an epoxy resin can be mentioned. In addition, after the antireflection region formation, when the roughened particles are chemically or thermally unstable, a monomolecular film may be formed on the surface to stabilize the metal surface. As monomolecular films, thiol compounds and fatty acids can be mentioned. It is possible to apply a combination of several kinds of coating resin layers or monomolecular films described above.

(II) Present Inventive Method for Producing Electroconductive Substrate

Next, the present inventive method for producing an electroconductive substrate will be described. As described above, the present inventive electroconductive substrate includes a base material and a metal wiring formed on the base material, and an antireflection region is formed on at least part of the surface of the metal wiring. Thus, the method for producing an electroconductive substrate includes, as basic steps, a combination of a step of forming a metal wiring on a base material and a step of forming an antireflection region on the formed metal wiring.

a. Step of Forming Metal Wiring

The step of forming a metal wiring is a step in which a predetermined metal ink is applied to a substrate to fix metal particles in the metal ink onto the substrate, and then the metal particles are bound to each other. As described above, a metal ink is a metal particle dispersion liquid obtained by dispersing, in solvent, metal particles that are in the state of being bound to a protective agent. For suitably forming a metal wiring in the present invention, the configuration of a favorable metal ink is as follows.

a-1. Metal Ink

The metal particles dispersed in the metal ink are made of at least either metal of silver and copper as described above. The metal particles in the metal ink preferably has a metal average particle size of 40 nm or more and 150 nm or less and a particle size distribution with a 10% particle size ($D_{10}$) of 40 nm or more and 100 nm or less. The particle size of the metal particles in the metal ink of the present invention is coarser as compared with the metal particles in the conventional metal ink for metal wiring formation (Patent Document 1, etc.). This is because the metal particles in the metal ink in the present invention form roughened particles on the wiring surface in addition to forming the main body (skeleton) of the metal wiring. In addition, the present invention is also addressed at the problem of accommodating the film thickening of metal wirings. In order to form a thick film, it is preferable to increase the particle size of metal particles; also in consideration of this, the above particle size range has been set. Incidentally, a 10% particle size ($D_{10}$) is a cumulative 10% particle size in a particle size accumulation curve (on a number basis) measured from particles observed under a microscope, such as SEM, by an image analysis method or with a particle size distribution meter, for example. In addition, the range of the average particle size of the metal particles in the metal ink described above considers that the roughened particles are formed through the sintering of the metal particles. As a result of sintering, the particle size of the roughened particles tends to become coarser than the particle size of the metal particles in the metal ink used.

A protective agent in a metal ink is an additive for suppressing the aggregation or excessive coarsening of metal particles and stabilizing the dispersed state. The aggregation of metal particles not only causes metal precipitation during the storage or use of the metal ink, but also affects the sintering characteristics after joining to the base material. Accordingly, the addition of a protective agent that suppresses such aggregation is indispensable.

As the protective agent for the metal ink used in the present invention, it is preferable that two systems of compounds having different basic structures are compositely used. Specifically, it is preferable to apply two kinds of protective agents, that is, a protective agent A made of an amine compound and a protective agent B made of a fatty acid.

In the amine compound (protective agent A), it is preferable that the total number of carbon atoms is 4 or more and 12 or less. This is because the number of carbon atoms in an amine affects the stability of the metal particles and the sintering characteristics at the time of pattern formation.

In addition, with respect to the number of amino groups in the amine compound, a (mono)amine having one amino group or a diamine having two amino groups is applicable. In addition, the number of hydrocarbon groups bonded to an amino group is preferably one or two, that is, a primary amine ($RNH_2$) or a secondary amine ($R_2NH$) is preferable. Then, when a diamine is applied as a protective agent, it is preferable that at least one or more amino group is a primary amine or a secondary amine. The hydrocarbon group bonded to an amino group may be a chain hydrocarbon having a linear structure or a branched structure, or may alternatively be a hydrocarbon group having a cyclic structure. In addition, oxygen may be partially contained.

As specific examples of amine compounds applied as protective agents in the present invention, butylamine ($C_4$), 1,4-diaminobutane ($C_4$), 3-methoxypropylamine ($C_4$), pentylamine ($C_5$), 2,2-dimethylpropylamine ($C_5$), 3-ethoxypropylamine ($C_5$), N,N-dimethyl-1,3-diaminopropane ($C_5$), hexylamine ($C_6$), heptylamine ($C_7$), benzylamine ($C_7$), N,N-diethyl-1,3-diaminopropane ($C_7$), octylamine ($C_8$), 2-ethylhexylamine ($C_8$), nonylamine ($C_9$), decylamine ($C_{10}$), diaminodecane ($C_{10}$), undecylamine ($C_{11}$), dodecylamine ($C_{12}$), diaminododecane ($C_{12}$), and the like can be mentioned. Incidentally, as the amine compound (protective agent A), for the purpose of adjusting the dispersibility or low-temperature sinterability of the metal particles in the metal ink, a mixture/combination of a plurality of kinds of amine compounds may also be used. In addition, as long as at least one kind of amine compound in which the total number of carbon atoms is 4 or more and 12 or less is contained, an amine compound in which the number of carbon atom is outside this range may also be present.

Meanwhile, the fatty acid applied as a protective agent B acts as an auxiliary protective agent for the amine compound in the metal ink, and enhances the stability of the metal particles. Then, the action of a fatty acid clearly appears after the metal particles are applied to the base material, and the addition of a fatty acid makes it possible to form a metal pattern having a uniform film thickness. This action can be notably understood in comparison with the case of applying metal particles without a fatty acid. From metal particles without a fatty acid, a stable metal pattern cannot be formed.

The fatty acid is preferably a $C_{4-24}$ unsaturated fatty acid or saturated fatty acid. As preferred fatty acids, specifically, saturated fatty acids such as butanoic acid ($C_4$), pentanoic acid ($C_5$), hexanoic acid ($C_6$), heptanoic acid ($C_7$), octanoic acid ($C_8$), nonanoic acid ($C_9$), decanoic acid (also called: capric acid, $C_{10}$), undecanoic acid (also called: undecylic acid, $C_{11}$), dodecanoic acid (also called: lauric acid, $C_{12}$), tridecanoic acid (also called: tridecyl acid, $C_{13}$), tetradecanoic acid (also called: myristic acid, $C_{14}$), pentadecanoic acid (also called: pentadecylic acid, $C_{15}$), hexadecanoic acid (also called: palmitic acid, $C_{16}$), heptadecanoic acid (also called: margaric acid, $C_{17}$), octadecanoic acid (also called: stearic acid, $C_{18}$), nonadecanoic acid (also called: nonadecylic acid, $C_{19}$), eicosanoic acid (also called: arachidic acid, $C_{20}$), behenic acid (also called: docosanoic acid, $C_{22}$), and lignoceric acid (also called: tetracosanoic acid, $C_{24}$), and unsaturated fatty acids such as palmitoleic acid ($C_{16}$), oleic acid ($C_{18}$), linoleic acid ($C_{18}$), linolenic acid ($C_{18}$), arachidonic acid ($C_{20}$), erucic acid ($C_{20}$), and nervonic acid (also called: cis-15-tetrachocenic acid, $C_{24}$). Oleic acid, linoleic acid, stearic acid, lauric acid, butanoic acid, and erucic acid are particularly preferable. Incidentally, also as the fatty acid (protective agent B) described above, a combination of several kinds may be used. In addition, as long as at least one kind of unsaturated fatty acid or saturated fatty acid in which the number of carbon atoms is 4 or more and 24 or less is contained, other fatty acids may also be present.

Metal particles protected with the various protective agents described above are dispersed in a solvent to give a metal ink. Solvents favorable for the metal ink are organic solvents, and a solvent containing either a polar solvent having a boiling point of 50 to 240° C. or a nonpolar solvent having a boiling point 80 to 260° C. is preferable. Specific examples thereof include alcohol, benzene, toluene, and alkane. They may also be mixed. Preferred solvents are alkanes, such as hexane, heptane, octane, nonane, and decane, and alcohols, such as methanol, ethanol, propanol, butanol, pentanol, hexanol, heptanol, octanol, nonanol, and decanol. The solvent is more preferably a mixed solvent of one or two or more kind of alcohol and one or two or more kinds of alkane selected from them.

The metal particle content in the metal ink is preferably such that the metal mass relative to the liquid mass is 20 mass % or more and 60 mass % or less. When the metal particle content is less than 20%, a metal pattern having a uniform film thickness for ensuring sufficient electroconductivity cannot be formed in a pattern formation area, and the resulting metal pattern has an increased resistance value. When the metal particle content is more than 60%, due to the aggregation/enlargement of the metal particles, it is difficult to form a stable metal pattern. Incidentally, when a metal wiring is formed from an alloy or mixture of both metals of silver and copper, a metal ink containing both silver particles and copper particles can be applied.

With respect to the protective agent content in the metal ink, the amine compound (protective agent A) is preferably such that the ratio of the number of moles of the amine ($mol_{amine}$) to that of the metal ($mol_{metal}$) in the metal ink ($mol_{amine}/mol_{metal}$) is 0.001 or more and 0.024 or less. In addition, the content of the fatty acid (protective agent B) is preferably such that the ratio of the number of moles of the fatty acid ($mol_{fatty}$ acid) to that of the metal ($mol_{metal}$) in the metal ink ($mol_{fatty}$ acid/$mol_{metal}$) is 0.0001 or more and 0.002 or less. Even when the protective agent content in the metal ink is more than the above suitable ranges, the dispersibility of the metal particles is not affected. However, excessive protective agents affect the low-temperature sinterability of the metal particles or the resistance value of the formed metal pattern. Therefore, the content is preferably within the above ranges. In addition, as a metal ink for metal wiring formation in the present invention, an ink containing, as a constituent component, metal particles coarser than conventional is applied. In the metal ink containing coarse metal particles, the content of each protective agent described above is a numerical value preferable in terms of achieving suitable dispersibility and fixability to a base material. Incidentally, with respect to the number of moles in the protective agent described above, when several kinds of amine compounds or fatty acids are used, the total number of moles is applied in each ease.

a-2. Step of Forming Metal Wiring from Metal Ink

In the step of forming a metal wiring, the metal ink described above is applied to a base material. As a method for ink application, dipping, spin coating, or a roll coater can be applied. It is also possible that the ink is dripped and spread by use of an applying member such as a blade, a squeegee, or a spatula. After the application, the solvent in the metal ink volatilizes, and also the metal particles on the base material are bound to each other and sintered to form a metal film, whereby a metal wiring is formed.

The sintering of metal particles is a phenomenon that can occur even at room temperature (self-sintering). Thus, a step of heating the base material is not indispensable in the formation of a metal pattern. However, when the sintered metal pattern is calcined, the protective agent (amine compound, fatty acid) remaining in the metal film can be completely removed, whereby the resistance value can be reduced. This calcination treatment is preferably performed at 40° C. or more to 250° C. Less than 40° C. is undesirable in that the desorption of the protective agent or volatilization takes a long period of time. In addition, a temperature of more than 250° C. causes deformation in the resin base material and the like. The calcination time is preferably 10 minutes or more and 120 minutes or less. Incidentally, the calcination step may be performed in an atmospheric or vacuum atmosphere.

As a result of the application of the metal ink and the binding/sintering of the metal particles, a metal wiring can be formed. By performing these steps at least once, one or more metal wiring layers can be formed. By repeatedly performing the application of the metal ink and the binding of the metal particles, a metal wiring having an arbitrary film thickness can be formed. In particular, the metal ink applied in the present application contains metal particles having a relatively large particle size, and, as a result of repeated application, a thick-film metal wiring can be formed. In addition, a metal wiring having a multilayer structure can be formed by repeated application. For example, it is possible that a lower-layer metal wiring is formed from a silver metal ink (silver wiring), and an upper-layer metal wiring is formed form a copper metal ink (copper wiring), thereby forming a metal wiring having a two-layer structure.

The application of a metal ink and the calcination of sintered metal particles described above are the basic steps of metal wiring formation. Then, in the present invention, it is more preferable that the method for forming a metal wiring disclosed by the present applicant described above (Patent Document 1) is applied to form a metal wiring. According to this method for forming a metal wiring, in the present invention, a base material including a fluorine-containing resin layer at least on a surface containing a pattern formation area is applied, and, first, a functional group is formed in the pattern formation area on the fluorine-containing resin layer surface. Then, subsequently, a metal ink is applied to the base material surface to join metal particles to the pattern formation area, and also the metal particles are bound to each other, thereby forming a metal wiring.

In this step of forming a metal wiring, (1) a base material having a fluorine-containing resin layer with liquid repellency is selected, (2) the base material surface is subjected to a predetermined treatment to alter a pattern formation area on the fluorine-containing resin surface, thereby forming a functional group, and then, (3) by use of a metal ink containing a protective agent, metal particles in the ink are selectively fixed to the altered portion of the fluorine-containing resin surface, thereby making it possible to form a high-definition wiring ion pattern. These steps will each be described in further detail.

The purpose of specifying the base material to include a fluorine-containing resin layer on a surface containing a pattern formation area is to impart liquid repellency to the base material surface when forming a wiring. After imparting liquid repellency to the base material surface, a functional group is formed on part of the surface. As a result, the ink is repelled by a portion having no functional group. The configuration of the fluorine-containing resin layer is as described above. As the fluorine-containing resin layer, one previously formed on the base material may be used. Alternatively, such a layer may also be formed on a base material that does not have a fluorine-containing resin layer by application or the like as a step of metal wiring formation.

When a fluorine-containing resin layer is formed on the base material, such formation can be accommodated by applying a fluorine-containing resin dissolved in a suitable solvent. The application is followed by calcination, whereby a fluorine-containing resin layer is formed. The method for applying a fluorine-containing resin is not particularly limited to dipping, spin coating, a roll coater, or the like. After the fluorine-containing resin is applied, a post-treatment according to the kind of resin (drying treatment, calcination treatment) is performed to form a fluorine-containing resin layer.

Next, a functional group is formed on the fluorine-containing resin layer surface on the base material. This functional group refers to a functional group formed by cleaving the covalent bond of the fluorine-containing resin. Specifically, a carboxyl group, a hydroxyl group, or a carbonyl group is formed.

As a treatment method for forming a functional group on the fluorine-containing resin layer surface, UV irradiation, a corona discharge treatment, a plasma discharge treatment, and excimer laser irradiation are possible. According to these treatments, a photochemical reaction is produced on the fluorine-containing resin surface to cleave the covalent bond, and such a treatment needs to be the application of moderate energy. As a guide, the amount of energy applied to the pattern formation area is preferably 1 $mJ/cm^2$ or more and 4,000 $mJ/cm^2$ or less. For example, in the case of UV irradiation, UV irradiation at a wavelength within a range of 10 nm or more and 380 nm or less is preferable, and UV irradiation at a wavelength within a range of 100 nm or more and 200 nm or less is particularly preferable.

In the UV irradiation or the like of the fluorine-containing resin layer surface, generally, an exposure treatment by use of a photomask (reticule) is performed. In the present invention, as the exposure mode, a non-contact exposure mode (proximity exposure, projection exposure) and a contact exposure mode (contact exposure) are both applicable. In proximity exposure, the interval between the mask and the fluorine-containing resin layer surface is preferably 10 µm or less, and more preferably 3 µm or less.

As described above, the base material is subjected to treatments for forming a fluorine-containing resin layer and forming a functional group in the pattern formation area, and this base material is brought into contact with a metal ink. In this process, a functional group for selectively fixing metal particles has been previously formed in the pattern formation area, and thus the metal ink can be spread all at once to form a pattern, which is efficient. At this time, the metal ink (metal particles) is repelled by the base surface of the fluorine-containing resin without a functional group due to its liquid repellency. When an applying member such as a blade is used, the repelled metal ink is removed from the base material surface. Meanwhile, in the pattern formation area having a functional group, a substitution reaction occurs between the protective agent in the metal particles and the functional group, whereby the metal particles are fixed to the base material. Subsequently, as in the basic steps described above, a metal wiring is formed through the binding/sintering of the metal particles and calcination.

The metal wiring formation process including the application of a fluorine resin base material and the functional group formation step is particularly suitable for the formation of a high-definition metal wiring having a small line width. However, the metal wiring on the present inventive electroconductive substrate is not limited to this process, and can be produced by the basic steps described above.

b. Step of Forming Antireflection Region

In the present invention, an antireflection region is formed on the metal wiring formed as described above. This step of forming an antireflection region is a step in which a blackening ink obtained by dispersing blackened particles in a solvent is applied onto the metal wiring. As a result, the blackened particles are embedded in the space between the roughened particles of the metal wiring, thereby forming an antireflection region.

b-1. Blackening Ink

As the blackening ink used in the step for forming an antireflection region, some modes can be mentioned depending on the kind of blackened particles. That is, the blackened particles can be composed of, in addition to metal particles made of silver (compound) or copper (compound), nonmetal particles, such as carbon and cellulose. The components of the blackening ink are based on the constituent materials.

When the blackened particles are metal particles made of silver (compound) or copper (compound), the basic configuration of the blackening ink is the same as that of the metal ink for metal wiring formation. That is, it is preferable that in addition to metal particles made of silver or copper, the same protective agent and solvent as in the metal ink described above are contained. However, it is important for the blackening ink to be a metal ink obtained with a protective agent added to metal particles having a fine particle size and with the mixture dispersed in a solvent. The metal particles preferably have an average particle size of 5 nm or more and 80 nm or less and a particle size distribution with a 10% particle size ($D_{10}$) of 5 nm or more and 60 nm or less. The average particle size is more preferably 5 nm or more and 50 nm or less. That is, when silver or the like is used as blackened particles, the applied blackening ink has the same configuration as the conventional metal ink for metal wiring formation. Incidentally, because the blackening particles are not formed by sintering, the average particle size of the metal particles in the blackening ink is often close to the average particle size of the blackened particles. The same applies to the below-described blackening inks made of carbon and the like.

When this metal ink is used as a blackening ink, it is preferable to use a metal ink in which the same amine compound (protective agent A) and fatty acid (protective agent B) as in the above metal ink are applied as a protective agent, and the protective agent is dispersed in a solvent in the state of being bound to metal particles, which are blackened particles. Further, the solvent is also preferably the same as in the metal ink. Incidentally, within the amine compound and fatty acid ranges described above, the protective agent in the blackening ink may be completely the same, partially the same, or different.

With respect to the protective agent content in the blackening ink, the protective agent A (amine compound) content is preferably such that the ratio of the number of moles of the amine ($mol_{amine}$) to that of the metal ($mol_{metal}$) in the metal ink ($mol_{amine}/mol_{metal}$) is 0.01 or more and 0.32 or less. In addition, the protective agent B (fatty acid) content in the blackening ink is preferably such that the ratio of the number of moles of the fatty acid ($mol_{fatty\ acid}$) to that of the metal ($mol_{metal}$) in the metal ink ($mol_{fatty\ acid}/mol_{metal}$) is 0.001 or more and 0.05 or less. The metal particles in the blackening ink have a fine particle size, and, in consideration of their dispersibility, the content is preferably within the above ranges.

In addition, as a combination of a metal constituting the metal wiring and a metal constituting the antireflection region (blackened particles), the same metal may be used, and a combination of different metals is also possible. For example, a silver ink can be used as the metal ink to form the metal wiring, and a copper ink can be applied as the blackening ink. In addition, even when the blackened particles are composed of a compound of silver or copper, the above blackening ink is used for the blackened particles. When the blackened particles are made of a compound, blackening ink application is followed by a heat treatment or the like, thereby converting silver or copper into a compound.

Meanwhile, when carbon or an organic substance is used as the blackened particles, a blackening ink obtained with fine particles of such carbon or an organic substance dispersed in a solvent is applied. Preferred nonmetal blackened particles are carbon, polystyrene, polyurethane, an acrylic resin, an epoxy resin, a melamine resin, glycogen, amylose, cellulose, dextrin, glucan, fructan, and chitin, and thus it is preferable to use an ink containing fine particles thereof. With respect to the particle size of organic substance fine particles in the blackening ink, particles having an average particle size of 5 nm or more and 80 nm or less are preferable. The average particle size is more preferably 5 nm or more and 50 nm or less.

The solvent for the blackening ink of an organic substance is water, alkane, benzene, toluene, alcohol, ketone, aldehyde, or ether. Alternatively, they may also be mixed and used. More specifically, octane, decane, 1-propanol, 2-propanol, methyl ethyl ketone, diethyl ketone, and dibutyl ether are preferable. The concentration of the organic substance fine particles in the blackening ink is preferably 1 mass % or more and 50 mass % or less.

In the above blackening ink containing organic substance particles, as an additive having the function of a dispersing agent/protective agent, for example, an organic compound containing —OH, —CHO, —CO, —COOH, —$NH_2$, —$H_2PO^4$, —PO, —SH, or —$SO_3H$ as a functional group can be added/mixed. As specific additives, thiols such as 1,3-mercaptopropanediol and dodecanethiol, alcohols such as 1-butanol and 1-hexanol, carboxylic acids such as oleic acid, phosphates, and the like are preferable.

b-2. Formation of Antireflection Region from Blackening Ink

To the metal wiring having the roughened particles exposed to its surface, the blackening ink described above is applied, whereby an antireflection region is formed. As a method for applying the blackening ink, the same method as the method for applying a metal ink at the time of metal wiring formation can be employed. The metal or nonmetal blackened particles in the blackening ink bind to the surface of the metal wiring due to an adsorption phenomenon caused by a relatively weak interaction.

As a result of applying the blackening ink, on the metal wiring surface, regions forming valleys of the undulations formed by the roughened particles are filled with the blackened particles. The embedded blackened particle adsorb onto the metal wiring surface, forming an antireflection region. After the application treatment, the blackening ink may be allowed to stand or subjected to a drying treatment. Depending on the kind of blackened particles, the substrate may be heated at a low temperature after blackening ink application, thereby firmly binding the blackened particles. When the low-temperature heating treatment is performed, it is preferable that the temperature is 40° C. or more and 200° C. or less, and the treatment time is 30 seconds or more and 120 minute or less.

In addition, when silver or copper particles are used as the blackened particles, as a result of a heat treatment, the particles can be converted into blackened particles made of a compound. As a treatment in this case, heating is performed in air or in an oxidized/sulfurized atmosphere at a temperature of 60° C. or more and 200° C. or less for 1 minute or more and 120 minutes or less, whereby a compound such as an oxide or a sulfide can be formed.

As a result of the application of the blackening ink described above, the blackened particles are fixed to the undulations formed by the coarse metal particles on the metal wiring surface. This forms a metal wiring including an antireflection region, whereby a present inventive electroconductive substrate can be obtained.

Advantageous Effects of the Invention

In the present inventive electroconductive substrate described above, an antireflection region having a predetermined configuration is formed on a metal wiring. In the present invention, due to the action of the antireflection region, the reflection of incoming light is suppressed, and the metal wiring is hard to view. Therefore, by applying a transparent body as a base material, a truly transparent electroconductive substrate can be obtained.

In addition, in the present inventive method for producing an electroconductive substrate, a blackening ink is additionally applied onto a metal wiring formed from a metal ink having a predetermined configuration. As a result, the above antireflection region can be imparted to the metal wiring. The present inventive method for forming a metal wiring in which a predetermined metal ink is employed allows a high-definition metal wiring to be efficiently formed. Then, as a result of using the metal ink, the metal wiring can be efficiently antireflection-treated.

Further, the metal ink used in the present invention is preferable for forming a metal wiring from metal particles having a relatively large particle size. Then, as a result of using the metal particles having a large particle size, a thick-film metal wiring can be efficiently produced. Such a thick-film metal wiring is useful as a wiring for a film heater or the like. According to the present invention, an electroconductive substrate including a thick-film metal wiring with suppressed reflection can be achieved.

DESCRIPTION OF EMBODIMENTS

Figure 1:
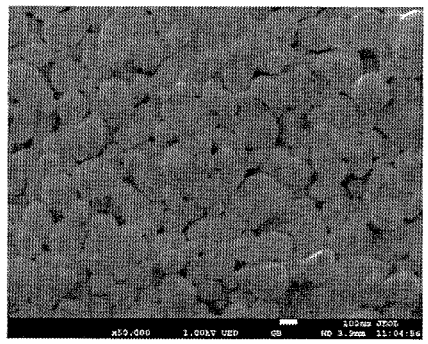
FIG. 1 shows SEM photographs of a metal wiring surface before and after the formation of an antireflection region on the electroconductive substrate produced in a first embodiment.
Figure 1:
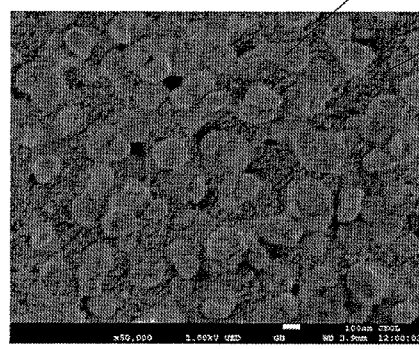

Hereinafter, preferred embodiments of the present invention will be described.

First Embodiment: In this embodiment, on a metal wiring made of silver, an antireflection region to which fine silver particle as blackened particles had been applied was formed, thereby a wiring board was produced.

Specifically, onto a base material having applied thereto a fluorine-containing resin, a silver ink containing silver particles having a large particle size was applied/printed as a metal ink to form a silver wiring, and then a silver ink containing fine silver particles was applied as a blackening ink to form an antireflection region, thereby producing an electroconductive substrate. In addition, with respect to the produced electroconductive substrate, the surface roughness of the wiring surface (center line average roughness) was measured, and also whether the silver wiring was visible via reflection was evaluated. The details of this embodiment will be described hereinafter.

[Preparation of Base Material, Formation of Fluorine-Containing Resin Layer, and Pretreatment]

A transparent resin substrate made of polyethylene naphthalate (dimension: 100 mm×100 mm) was prepared as a base material. To this resin substrate, an amorphous perfluorobutenyl ether polymer (CYTOP®: manufactured by Asahi Glass Co., Ltd.) was applied as a fluorine-containing resin by a spin coating method (rotation speed: 2,000 rpm, 20 sec), then heated at 50° C. for 10 minutes and subsequently at 80° C. for 10 minutes, further heated in an oven at 100° C. for 60 minutes, and thus calcined. As a result, a fluorine-containing resin layer of 1 μm was formed.

Next, this substrate having formed thereon a fluorine-containing resin layer was subjected to a pretreatment for forming a functional group. A photomask having a grid pattern (line width: 4 μm, line interval: 300 μm) was closely attached to the substrate, followed by irradiation with UV light (VUV light) (contact exposure at a mask-substrate distance of 0). The VUV light irradiation was performed at a wavelength of 172 nm and 11 mW/cm$^{-2}$ for 20 seconds.

[Production of Silver Ink]

In this embodiment, the metal ink and the blackening ink were both silver inks containing silver particles. Each ink was obtained by dispersing silver particles produced by a thermal decomposition method in a solvent. However, depending on the usage, these silver inks are different from each other in the particle size of silver particles. Thus, the production method for each silver ink will be described. Incidentally, a thermal decomposition method is a method in which a thermally decomposable silver compound, such as silver carbonate ($Ag_2CO_3$) or silver oxalate ($Ag_2C_2O_4$), is used as a starting material, a silver compound is allowed to react with a protective agent to form a silver complex, and the complex is, as a precursor, heated and decomposed to give silver particles.

[Production of Metal Ink (Ink for Wiring Formation)]

9.32 g of water was added to 25.56 g of a starting material silver carbonate to make a wet condition. Subsequently, 49.67 g of 3-methoxypropylamine was added to the silver compound as a protective agent amine compound to produce a silver-amine complex. The mixing of the silver compound and the amine was performed at room temperature to suitably reduce the non-complex area of the silver compound.

The above silver-amine complex was subjected to checking for the moisture content in the reaction system before heated, and the moisture content was set at 33 parts by weight per 100 parts by weight of silver carbonate. Then, the reaction system was heated from room temperature to decompose the silver-amine complex, whereby silver particles were deposited. As the heating temperature at the time, the decomposition temperature of the complex was assumed to be 110 to 130° C., and such a temperature was employed as the temperature to be reached. In addition, the heating rate was 10° C./min. In this heating step, the generation of carbon dioxide was confirmed from near the decomposition temperature. Heating was continued until the generation of carbon dioxide stopped, whereby a liquid having suspended therein silver particles was obtained. After the deposition of silver particles, methanol was added to the reaction liquid for washing, followed by centrifugation. The washing and centrifugation were performed twice.

To the methanol-wetted silver particles obtained above, 2,2,4-trimethyl-1,3-pentandiol monoisobutyrate (product name: NKY NG-120) was added for washing, followed by centrifugation. The washing and separation were performed twice. As a result, silver particles wetted with 2,2,4-trimethyl-1,3-pentandiol monoisobutyrate were obtained.

Then, to the silver particles, a mixed solvent of octane and 1-propanol (mixing ratio (volume ratio): 5:5) containing hexylamine (3,500 ppm), dodecylamine (800 ppm), and erucic acid (900 ppm) was added, thereby giving a silver ink to serve as a metal ink for wiring formation. The silver concentration in the silver ink was 50 mass %. Then, the silver particles in the silver ink to serve as a blackening ink had an average particle size of 125 nm. In addition, the 10% particle size ($D_{10}$) was 71 nm.

[Production of Blackening Ink (Ink for Antireflection Region)]

0.651 g of methanol was added to 1.519 g of a starting material silver oxalate to cause wetting. Then, amine compounds and a fatty acid to serve as a protective agent were added to the silver oxalate. Specifically, first, N,N-dimethyl-1,3-diaminopropane (0.778 g) was added and kneaded for a while, and then hexylamine (1.156 g), dodecylamine (0.176 g), and oleic acid (0.042 g) were added and kneaded, followed by heating and stirring at 110° C. During heating and stirring, the cream-colored silver complex gradually turned brown and further turned black. This heating/stirring operation was performed until the occurrence of bubbling from the reaction system stopped. After the completion of the reaction, the reaction system was allowed to cool to room temperature, and then methanol was added and thoroughly stirred, followed by centrifugation, whereby excess protective agent was removed, and silver fine particles were purified. The addition of methanol and the purification of silver fine particles by centrifugation were performed again to give silver fine particles as a precipitate.

Then, to the produced silver fine particles, a mixed solvent of octane and butanol (octane:butanol=4:1 (volume ratio)) was added to give a silver ink to serve as a blackening ink. The silver concentration in the silver ink was 40 mass %. Then, the silver particles in the silver ink to serve as a blackening ink had a particle size of 15 nm. In addition, the 10% particle size ($D_{10}$) was 10 nm.

[Step of Forming Metal Wiring]

The metal ink produced above was applied to the substrate pretreated as above, thereby forming a metal wiring. In the application of the metal ink, the metal ink was previously wet-spread over a point of contact between the base material and a blade (glass), and then the blade was swept in one direction. Here, the sweep rate was set at 2 mm/sec. It was confirmed that as a result of the application with the blade, the ink adhered only to the UV-irradiated part (functional group-formed part) of the base material. Then, the base material was dried with hot air at 120° C., and a silver wiring (line width: 4 μm) was formed. With respect to the grid pattern formed of the silver wiring (L/S=4 μm/300 μm, 125 mm long, 6 mm wide), terminals of a digital tester were brought into contact with the opposite ends to measure the electrical resistance value. The result was 2.2 kΩ. In addition, the film thickness of the metal wiring was 0.2 μm on average.

[Formation of Antireflection Region]

An antireflection region was formed on the metal wiring formed above. The blackening ink produced above was applied by use of a blade in the same manner as in the step of forming a metal wiring. Then, air was applied at room temperature for air-drying to vaporize the solvent.

Through the above steps, an electroconductive substrate having formed thereon a metal wiring (silver wiring) and an antireflection region were produced. The electroconductive substrate produced in this embodiment was a transparent electroconductive substrate on which the metal wiring was seemingly invisible.

With respect to the electroconductive substrate production process described above, the surface morphology immediately after the formation of the metal wiring and the surface morphology of the antireflection region after the fixing of the blackened particle were observed under SEM. The results are shown in FIG. 1. From FIG. 1, the surface of the metal wiring formed from the metal ink is covered with roughened particles (metal particles), and asperities are observed. Then, it was confirmed that as a result of applying thereto blackened particles made of fine silver particles, the blackened particles entered between the roughened particles. Based on these SEM observation results, the particle sizes of the roughened particles and blackened particles in the antireflection region were measured. In the particle size measurement, based on an SEM image (×50,000), 100 arbitrary particles of each kind were selected, and the particle size was calculated by a two-axis method. As a result, the average particle size of the roughened particles in this embodiment was 172 nm, and the average particle size of the blackened particles was 15 nm.

Next, with respect to the transparent electroconductive substrate produced in this embodiment, the surface roughness (center line average roughness) of the silver wiring (antireflection region surface) was measured. The surface roughness was measured based on AFM observation results (atomic force microscope: Nanocute manufactured by Hitachi High-Tech Science Corporation was used) (height direction 6 μm, resolution: 0.05 nm). In the AFM observation, a 10 μm×10 μm region on the silver wiring was arbitrarily selected and observed. Then, an arbitrary line (10 μm long) was drawn on the wiring, and the center line average roughness on this measuring line was measured. The center line average roughness of the silver wiring on the electroconductive substrate of this embodiment was 66 nm.

Next, with respect to the transparent electroconductive substrate produced in this embodiment, whether the metal wiring was visible due to reflected light was evaluated. In this evaluation, under an indoor white fluorescent lamp, the transparent electroconductive substrate was visually observed from right above with the angle being changed at ±90° in the vertical direction. In the same manner, the substrate was also visually observed from right above with the angel being changed at 90° in the right-and-left horizontal direction. When the mesh pattern of the silver wiring was clearly visible via specular reflection, reflection was judged as present. As a result, in the transparent electroconductive substrate produced in this embodiment, the presence of the metal wiring was not confirmed with reflected light.

In addition, with respect to the transparent electroconductive substrate produced in this embodiment, the electrical resistance value of the metal wiring was measured. The result was 2.1 kΩ. This value is favorable as a resistance value of a metal wiring, and it was confirmed that there was no deterioration in electroconductivity due to the antireflection region (blackened particles). The blackened particles cover the metal wiring only partially, and their mass is presumably not so large either. Accordingly, the influence on the entire metal wiring is limitative. In addition, in this embodiment, the use of silver particles as blackened particles is likely to be another reason for the reduced influence on the resistance value. In the present invention, the light absorption/scattering due to the particle size of blackened particles/surface morphology is utilized to suppress light reflection. This is substantially different from the technique of coloring a wiring, as in the conventional art (Patent Document 2).

Second Embodiment: In this embodiment, metal wirings (silver wirings) were formed from metal inks having different sizes of metal particles (silver particles), and then blackening inks containing various blackening inks (silver ink, carbon ink) were applied to form antireflection regions, thereby producing transparent electroconductive substrates.

As the metal inks for wiring formation, a silver ink having an average particle size of 125 nm ($D_{10}$=71 nm) and a silver ink having an average particle size of 60 nm ($D_{10}$=45 nm) were prepared. These silver inks were produced by the method for producing a silver ink for wiring formation in the first embodiment, with the moisture content and the heating rate during the heating decomposition of the silver-amine complex being adjusted. In addition, as a comparative example, a test in which the silver ink used as the blackening ink in the first embodiment (average particle size: 15 nm) was used as a metal ink for wiring formation was also performed. Further, a test in which a metal ink containing the same metal particles was applied several times was also performed.

As the carbon ink, a commercially available high-concentration carbon dispersion liquid (carbon particle size: 50 nm, carbon concentration: 10 mass %, dispersion medium: 3-pentanone) was used.

In this embodiment, the same metal ink (silver ink) as in the first embodiment was applied to the same base material as in the first embodiment to form a metal wiring. Then, the blackening ink was applied to the metal wiring. The blackening ink was applied in the same manner as in the first embodiment. In the treatment after the application of the blackening ink, a metal ink (silver ink) was applied as a blackening ink, followed by drying at room temperature as in the first embodiment. In addition, in the case of carbon ink, application was followed by heating at 60° C. for 3 minutes to achieve drying and fixing of the blackened particles. The application of the blackening ink was performed once.

Incidentally, in this embodiment, in addition to the metal wiring formation tests by combinations of a metal ink and a blackening ink as described above, as a conventional example, the formation of a metal wiring only by applying a metal ink (particle size: 120 nm, 15 nm) was also performed.

Then, with respect to each electroconductive substrate produced in this embodiment, in the same manner as in the first embodiment, the surface morphology was studied, the presence of light reflection on the metal wiring (wiring visibility) was evaluated, and the resistance value was measured. In the visibility evaluation, the substrate was observed under the same conditions as in the first embodiment. A rating of "0" was given up to the case where the silver wiring was partially visible on the entire substrate. The case where the silver wiring was visible in half or less of the area was rated as "○", and the case where the silver wiring was visible in half or more of the area was rated as "x". In addition, in the evaluation of the resistance value, 2.5 kΩ, which is a resistance value on the same level as the resistance value 2.3 kΩ of the blackened particle-free silver wiring of the conventional example (No. 7 in the following Table 1), was taken as a standard. 2.5 kΩ or less was rated as "O", more than 2.5 kΩ and 3.5 kΩ or less was rated as "O", and more than 3.5 kΩ was rated as "x". The results of the above measurement and evaluation are shown in Table 1.

Figure 2:
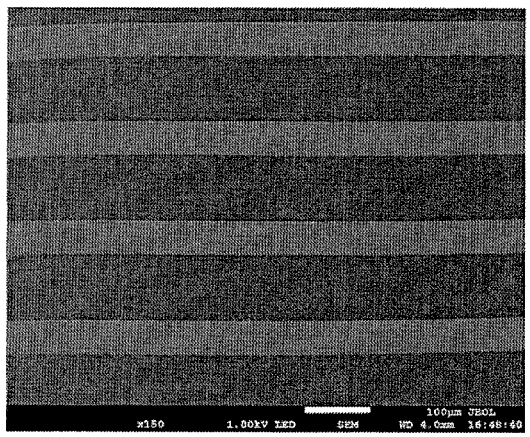
FIG. 2 shows SEM photographs of metal wiring surfaces on electroconductive substrates produced in a second embodiment.
Figure 2:
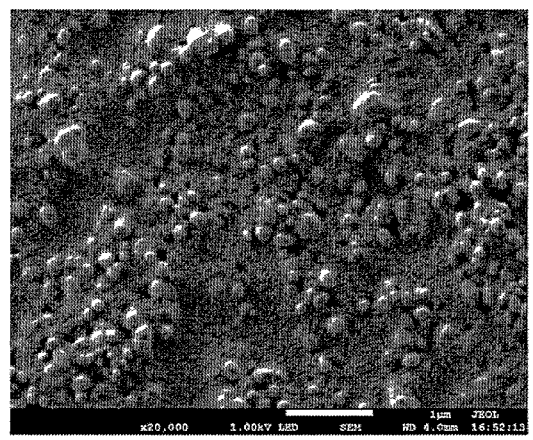
Figure 2:
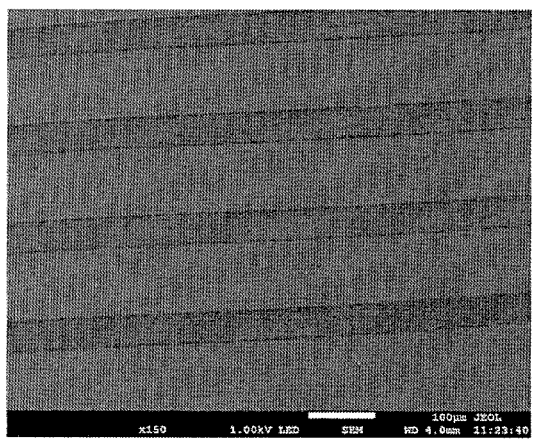
Figure 2:
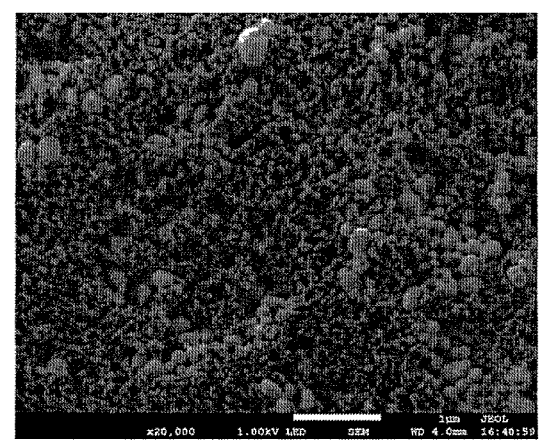
Figure 3:
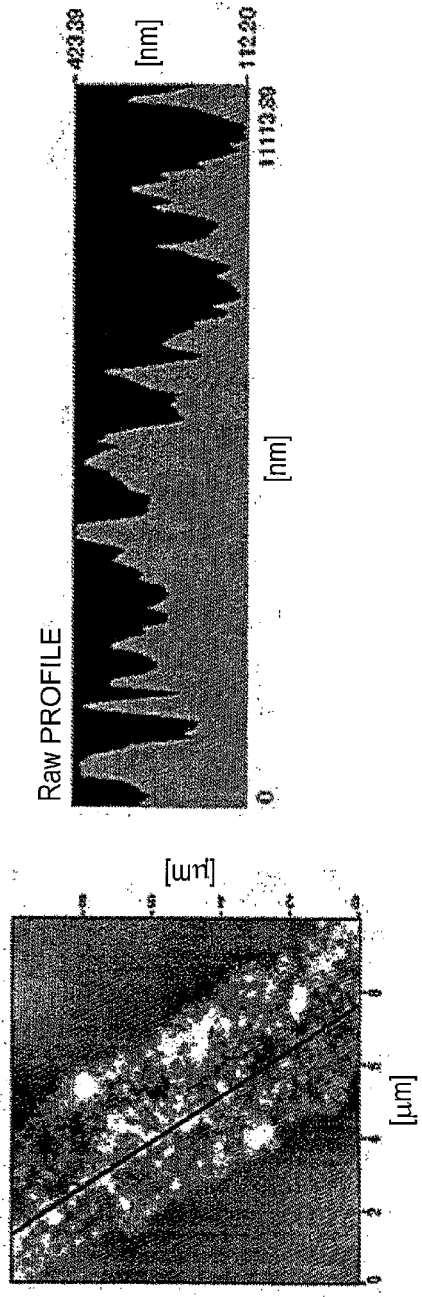
FIG. 3 shows two-dimensional AFM images of metal wiring surfaces on electroconductive substrates produced in the second embodiment, together with sectional profiles of the measuring line.
Figure 3:

FIG. 2 shows examples of SEM photographs of the metal wirings on the electroconductive substrates produced in this embodiment (No. 1 and No. 8). As in the first embodiment, the morphology is such that some regions of the roughened particles (silver particles) are buried under the blackened particles. FIG. 3 is AFM two-dimensional images showing the surface morphologies of these metal wirings. As in FIG. 3, an arbitrary line (10 μm long) was drawn on each wiring, and the center line average roughness on this measuring line was measured. The right figures in FIG. 3 each show the sectional profile on the measuring line on the wiring (antireflection region). The center line average roughnesses of the silver wirings on these electroconductive substrates were 43.2 nm (No. 1) and 39.6 nm (No. 8), respectively. In the same manner, the metal wirings on the other electroconductive substrates were also measured for center line average roughness.

TABLE 1

| | Wiring Formation + Antireflection Region Formation | | | | Surface morphology | | | Evaluation results | | |
|---|---|---|---|---|---|---|---|---|---|---|
| | Metal ink | | Blackening ink | | Roughened | Blackened | Center line | | Electrical | |
| No. | Kind of metal | Particle size | Kind | Particle size | particle average particle size | particle average particle size | surface roughness | Wiring visibility | resistance value | Remarks |
| 1 | Silver | 120 nm | Silver | 15 nm | 172.9 nm | 14.6 nm | 43.2 nm | ⊙ | ⊙ | Example |
| 2 | | 120 nm | | 120 nm | 163.8 nm*1 | 130.1 nm | 74.3 nm | X | ⊙ | Comparative Example |
| 3 | | 60 nm | | 15 nm | 92.3 nm | 13.2 nm | 26.5 nm | ○ | ⊙ | Example |
| 4 | | 15 nm | | 15 nm | 43.0 nm*1 | 14.1 nm | 5.0 nm | X | ⊙ | Comparative Example |
| 5 | | 15 nm | | 120 nm | 55.4 nm*1 | 124.6 nm | 77.2 nm | X | ⊙ | Comparative Example |
| 6 | | 120 nm | | — | 188.6 nm | — | 71.6 nm | X | ⊙ | Conventional Example |
| 7 | | 15 nm | | | 53.1 nm | — | 5.3 nm | X | ⊙ | Conventional Example |
| 8 | | 120 nm | Carbon | 50 nm | 184.5 nm | 51.7 nm | 39.6 nm | ⊙ | ⊙ | Example |

TABLE 1-continued

| | Wiring Formation + Antireflection Region Formation | | | | Surface morphology | | | Evaluation results | | |
|---|---|---|---|---|---|---|---|---|---|---|
| | Metal ink | | Blackening ink | | Roughened | Blackened | Center line | | Electrical | |
| No. | Kind of metal | Particle size | Kind | Particle size | particle average particle size | particle average particle size | surface roughness | Wiring visibility | resistance value | Remarks |
| 9 | | 60 nm | | | 102.2 nm | 55.9 nm | 29.5 nm | ○ | ⊙ | Example |
| 10 | | 15 nm | | | 48.8 nm | 47.0 nm | 13.1 nm | X | ⊙ | Comparative Example |

*[1]With respect to No. 2, No. 4, and No. 5, the blackened particles were peeled to measure the particle size of the roughened particles.

In Table 1, in both the conventional metal wirings (No. 6 and No. 7), where a blackening ink (blackened particles) was not applied, and no antireflection region was formed, the metal wiring was visible via reflection. More specifically, in No. 7 with fine particles, a garish metal wiring with metallic luster was observed. In addition, in No. 6 with coarse particles, a metal wiring that did not have luster but was pale white was observed. As can be seen from the results of the center line average roughness measurement, presumably, a difference occurred in the surface morphology of the metal wiring depending on the particle size of the metal particles in the metal ink, leading to the difference in vision.

Then, from Table 1, in the metal wiring having an antireflection region with a favorable center line average roughness due to the suitable combination of a metal ink and a blackening ink, reflection was sufficiently suppressed, and the visibility was good (No. 1, No. 3, No. 8, and No. 9). The usefulness of the surface morphology formed from roughened particles and blackened particles finer than the roughened particles was confirmed. In addition, the blackened particles are not limited to the same metal as the metal wiring (silver), and carbon is also effective.

In contrast, in the metal wiring where the center line average roughness was outside the suitable range due to the combination of a metal ink and blackening ink, it was confirmed that the presence was visible via reflection (No. 2, No. 4, No. 5, and No. 10). Specifically, although the same metal ink having a coarse particle size was applied several times like No. 2, a favorable center line average roughness was not achieved, and the visibility of the metal wiring was not improved. Meanwhile, when the metal ink having a fine particle size was applied several times like No. 4, as in the single application (No. 7), a garish metal wiring was visible.

Incidentally, the metal wirings of No. 2 and No. 4 were formed by applying silver particles having the same particle size twice. When the antireflection region was SEM-observed, the main silver particles observed on the surface were silver particles that were assumed to be blackened particles. Then, it was difficult to distinction between roughened particles and blackened particles. Thus, in this embodiment, with respect to these comparative examples, after the average particle size of the surface blackened particles, the center line average roughness, and the like were measured, peeling with an adhesive tape was repeated to forcibly separate blackened particles and expose roughened particles. Subsequently, the silver particles that appeared on the metal wiring surface were taken as roughened particles, and their average particle size was measured.

In addition, in No. 5, after a metal wiring was formed from fine metal particles, coarse metal particles (blackening ink) was applied. However, the surface morphology aimed at by the present invention was not obtained. Incidentally, also in the metal wiring of the No. 5, it was difficult to distinguish between roughened particles and blackened particles. Thus, blackened particles were peeled in the same manner as above to measure the particle size of roughened particles. In addition, in this No. 5, the silver particles observed after peeling had a smaller average particle size than the blackened particles, and such particles were taken as roughened particles and described in Table 1. This is because, as described above, the roughened particles in the present invention are metal particles that constitute the main body of the metal wiring, and also are metal particles communicating with and in contact with the metal wiring.

Then, No. 10 is an example where carbon was applied as blackened particles. However, as in No. 5, because the metal wiring was formed from fine metal particles, and coarser particles were then applied, a favorable surface morphology was not obtained. In the metal wiring of No. 10, although the wiring was colored as a result of carbon ink application, the underlying silver wiring was so flat and smooth that it failed to suppress reflection on the silver wiring, and garishness was observed. As can be seen from the results of No. 10, it can be said that reflection suppression by coloring is not necessarily useful.

Further, with respect to the electroconductivity of the metal wiring (electrical resistance value), it was confirmed that the electroconductive substrates including the metal wirings of the examples of this embodiment all had good electroconductivity (No. 1, No. 3, No. 8, and No. 9). From above, it was confirmed that the present inventive electroconductive substrate was an electroconductive substrate including a metal wiring with suppressed reflection, whose electroconductivity, its original function, was also excellent.

INDUSTRIAL APPLICABILITY

As described above, the present invention is an electroconductive substrate that includes a high-definition and/or thick-film metal wiring that has been subjected to a treatment to prevent light reflection. The present invention is useful for the formation of electrodes/wirings of various semiconductor devices. In addition, the present invention is also effectively applicable to the formation of fine metal wirings on the panel surface of a touch panel, where light transmittance is required. In addition, the present invention is also useful for thick-film metal wirings, such as film heaters.

The invention claimed is:

1. An electroconductive substrate comprising a base material and a metal wiring formed on at least one surface of the base material and made of at least either of silver and copper, wherein on part or all of a surface of the metal wiring, an antireflection region containing roughened particles that are made of at least either of silver and copper and blackened particles that are embedded between the roughened particles and finer than the roughened particles is formed, the blackened particles are made of at least one of silver or a silver compound, copper or a copper compound, and carbon or an organic substance having a carbon content of 25 wt % or more, and the antireflection region has a surface with a center line average roughness of 15 nm or more and 70 nm or less.

2. The electroconductive substrate according to claim 1, wherein the blackened particles are a silver compound or a copper compound in the form of an oxide, a sulfide, or a chloride.

3. The electroconductive substrate according to claim 2, wherein the roughened particles have an average particle size of 40 nm or more and 150 nm or less.

4. The electroconductive substrate according to claim 2, wherein the metal wiring has a width of 0.5 μm or more and 30 μm or less.

5. The electroconductive substrate according to claim 1, wherein the blackened particles are made of at least one of carbon, polystyrene, polyurethane, an acrylic resin, an epoxy resin, a melamine resin, glycogen, amylose, cellulose, dextrin, glucan, fructan, and chitin.

6. The electroconductive substrate according to claim 5, wherein the roughened particles have an average particle size of 40 nm or more and 150 nm or less.

7. The electroconductive substrate according to claim 1, wherein the roughened particles have an average particle size of 40 nm or more and 150 nm or less.

8. The electroconductive substrate according to claim 1, wherein the metal wiring has a width of 0.5 μm or more and 30 μm or less.

9. The electroconductive substrate according to claim 1, wherein the metal wiring has a thickness of 0.08 μm or more and 10 μm or less.

10. The electroconductive substrate according to claim 1, wherein the base material is formed of a transparent body.

11. The electroconductive substrate according to claim 1, wherein at least the surface of the base material having formed thereon the metal wiring is made of a fluorine-containing resin.

12. A method for producing an electroconductive substrate defined in claim 1, comprising the steps of:

forming a metal wiring by performing, at least once, a step of applying a metal ink obtained by dispersing at least one kind of metal particles of either silver or copper in a solvent to a base material and binding the metal particles to each other; and forming an antireflection region by performing, at least once, a step of applying a blackening ink obtained by dispersing at least one kind of blackened particles in a solvent to part or all of the metal wiring to embed the blackened particles between roughened particles on the metal wiring surface.

13. The method for producing an electroconductive substrate according to claim 12, wherein the metal particles in the metal ink are metal particles having an average particle size of 40 nm or more and 150 nm or less and a 10% particle size ($D_{10}$) of 40 nm or more and 100 nm or less.

14. The method for producing an electroconductive substrate according to claim 12, wherein the metal ink contains a protective agent that protects the metal particles, and the protective agent includes a protective agent A made of at least one $C_{4-12}$ amine compound and a protective agent B made of at least one $C_{4-24}$ fatty acid.

15. The method for producing an electroconductive substrate according to claim 12, wherein after the metal ink is applied to the base material, the base material is heated to 40° C. or more and 250° C. or less, whereby the metal particles are bound to each other to form a metal wiring.

16. The method for producing an electroconductive substrate according to claim 12, wherein the base material has set thereon a pattern formation area for forming a metal wiring, the base material is provided with a fluorine-containing resin layer at least on a surface containing the pattern formation area, and the step of forming a metal wiring is a step of forming a functional group in the pattern formation area on the fluorine-containing resin layer surface, then applying a metal ink to the base material surface to join metal particles to the pattern formation area, and then binding the metal particles to each other to form a metal wiring.

17. The method for producing an electroconductive substrate according to claim 16, wherein the fluorine-containing resin layer is made of a polymer having, as a repeating unit based on a fluorine-containing monomer that constitutes the polymer, at least one repeating unit having a ratio between the number of fluorine atoms and the number of carbon atoms (F/C) of 1.0 or more.

18. The method for producing an electroconductive substrate according to claim 13, wherein the step of forming a functional group on the fluorine-containing resin layer surface is to apply an energy of 1 mJ/cm$^2$ or more and 4,000 mJ/cm$^2$ or less to the pattern formation area on the fluorine-containing resin layer surface.

19. The method for producing an electroconductive substrate according to claim 16, wherein at least one of a carboxyl group, a hydroxyl group, and a carbonyl group is formed as the functional group.

\* \* \* \* \*